United States Patent
Lee

(10) Patent No.: US 10,565,151 B2
(45) Date of Patent: Feb. 18, 2020

(54) MEMORY DEVICES AND SYSTEMS WITH PARALLEL IMPEDANCE ADJUSTMENT CIRCUITRY AND METHODS FOR OPERATING THE SAME

(71) Applicant: Micron Technology, Inc., Boise, ID (US)

(72) Inventor: Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/019,254

(22) Filed: Jun. 26, 2018

(65) Prior Publication Data
US 2019/0139620 A1    May 9, 2019

Related U.S. Application Data

(60) Provisional application No. 62/583,608, filed on Nov. 9, 2017.

(51) Int. Cl.
*G06F 13/40* (2006.01)
*G11C 29/50* (2006.01)
*G11C 29/02* (2006.01)
*H05K 1/02* (2006.01)
(Continued)

(52) U.S. Cl.
CPC .......... *G06F 13/4086* (2013.01); *G06F 13/00* (2013.01); *G11C 29/023* (2013.01); *G11C 29/028* (2013.01); *G11C 29/50008* (2013.01); *H04L 25/0278* (2013.01); *H05K 1/025* (2013.01); *H05K 1/0246* (2013.01); *G11C 2207/2254* (2013.01)

(58) Field of Classification Search
CPC . G06F 13/4086; G06F 13/00; H04L 25/0278; H05K 1/0246; H05K 1/025
See application file for complete search history.

(56) References Cited

U.S. PATENT DOCUMENTS 7,420,386 B2 * 9/2008 Wang .................. G11C 7/1048
326/30
7,916,574 B1 * 3/2011 Solomon ................. G11C 5/04
365/230.06

(Continued)

OTHER PUBLICATIONS

International Application No. PCT/US2018/043198—International Search Report and Written Opinion, dated Nov. 6, 2018, 12 pages.

*Primary Examiner* — Vanthu T Nguyen
(74) *Attorney, Agent, or Firm* — Perkins Coie LLP

(57) ABSTRACT

Methods, systems, and apparatuses related to memory operation with common clock signals are provided. A memory device or system that includes one or more memory devices may be operable with a common clock signal without a delay from switching on-die termination on or off. For example, a memory device may comprise first impedance adjustment circuitry configured to provide a first impedance to a received clock signal having a clock impedance and second impedance adjustment circuitry configured to provide a second impedance to the received clock signal. The first impedance and the second impedance may be configured to provide a combined impedance about equal to the clock impedance when the first impedance adjustment circuitry and the second impedance adjustment circuitry are connected to the received clock signal in parallel.

24 Claims, 9 Drawing Sheets

(51) Int. Cl.
*H04L 25/02* (2006.01)
*G06F 13/00* (2006.01)

(56) References Cited

U.S. PATENT DOCUMENTS

| | | | | |
|---|---|---|---|---|
| 8,179,158 | B2* | 5/2012 | Flamm | H04L 25/0278 |
| | | | | 326/30 |
| 8,213,206 | B2* | 7/2012 | Chen | H05K 1/0286 |
| | | | | 326/30 |
| 8,274,850 | B2* | 9/2012 | Koshizuka | G11C 5/04 |
| | | | | 326/30 |
| 2004/0141391 | A1 | 7/2004 | Lee et al. | |
| 2008/0211548 | A1 | 9/2008 | Hayashi et al. | |
| 2013/0002291 | A1 | 1/2013 | Park | |
| 2015/0023104 | A1 | 1/2015 | Tanzawa | |
| 2015/0098285 | A1 | 4/2015 | Huber et al. | |
| 2019/0096468 | A1* | 3/2019 | McCall | G11C 11/4072 |

* cited by examiner

MEMORY DEVICES AND SYSTEMS WITH PARALLEL IMPEDANCE ADJUSTMENT CIRCUITRY AND METHODS FOR OPERATING THE SAME

CROSS-REFERENCE TO RELATED APPLICATIONS

This application claims the benefit of U.S. Provisional Application No. 62/583,608, filed Nov. 9, 2017, which is incorporated herein by reference in its entirety.

TECHNICAL FIELD

The present disclosure generally relates to memory devices and, more particularly, relates to memory devices and systems with parallel impedance adjustment circuitry and methods for operating the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Memory devices and memory systems can include multiple separately-addressable memory arrays, ranks, banks, channel, or other sub-divisions of memory capacity. In some such devices and systems, separate data clock terminals (e.g., for receiving an applied read data clock WCK or the like) can be provided to correspond with each separately-addressable memory array, rank, bank, channel, or other sub-division. This approach permits separate clock signals to be provided to the different sub-divisions of the memory only as needed. Alternatively, a single clock signal can be provided to the multiple terminals, although this approach can involve switching on-die termination on and off at each terminal depending upon whether the corresponding memory sub-division is being accessed. This latter approach can simplify the design of a memory host or controller (e.g., reducing the number of discrete clock signals it provides), but can undesirably increase the delays in switching between accessing one sub-division of memory and another (e.g., due to the time required to adjust the impedance at the different clock terminals). It is therefore desirable to provide a way to share a common clock signal across multiple clock terminals in a memory device or system, without the delays associated with switching on-die termination on and off as different corresponding portions of the memory device or system are accessed.

Accordingly, several embodiments of the present technology are directed to memory devices, systems including memory devices, and methods of operating memory devices in which a common signal can be connected to multiple terminals in parallel without switching on-die termination on and off (e.g., without the delay in adjusting impedances at the different terminals). In one embodiment, a memory device is provided, comprising first impedance adjustment circuitry configured to provide a first impedance to a received clock signal having a clock impedance, and second impedance adjustment circuitry configured to provide a second impedance to the received clock signal. The first impedance and the second impedance can be configured to provide a combined impedance about equal to the clock impedance when the first impedance adjustment circuitry and the second impedance adjustment circuitry are connected to the received clock signal in parallel.

Figure 1:
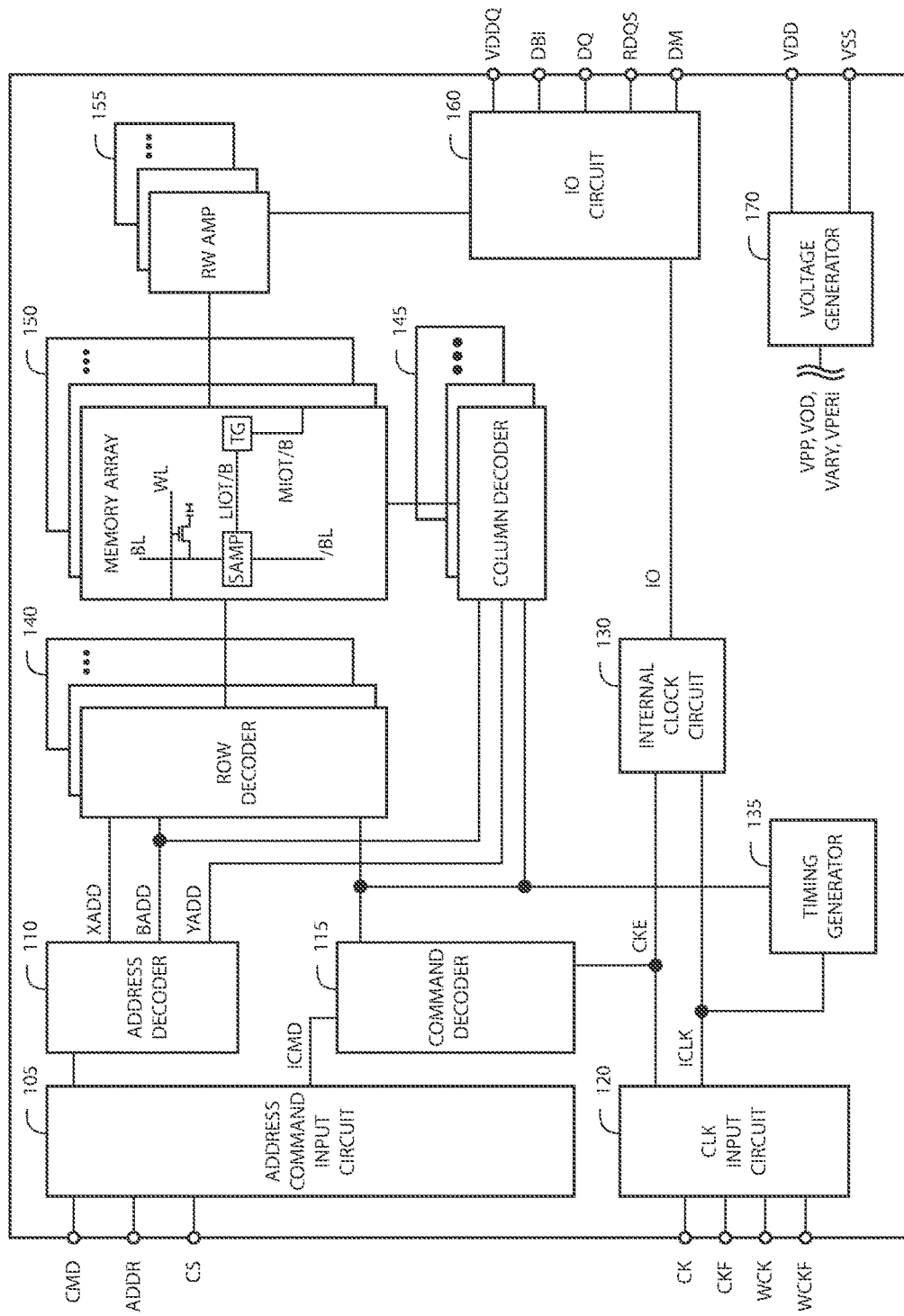
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 can include an array of memory cells, such as memory array 150. The memory array 150 includes a plurality of banks (e.g., banks 0-15 in the example of FIG. 1), each bank including a plurality of word lines (WL), a plurality of bit lines (BL), and a plurality of memory cells arranged at intersections of the word lines and the bit lines. The selection of a word line WL is performed by a row decoder 140, and the selection of a bit line BL is performed by a column decoder 145. Sense amplifiers (SAMP) are provide for corresponding bit lines BL and connected to at least one respective local I/O line pair (LIOT/B), which is in turn coupled to at least respective one main I/O line pair (MIOT/B), via transfer gates (TG), which function as switches.

The memory device 100 can employ a plurality of terminals (e.g., external terminals, pins, pads or the like, interconnections that can be external or internal to the device, etc.) that include command and address terminals coupled to a command bus and an address bus to receive command signals CMD and address signals ADDR, respectively. The memory device can further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals can be supplied with an address signal and a bank address signal from outside. The address signal and the bank address signal supplied to the address terminals are transferred, via a command/address input circuit 105, to an address decoder 110. The address decoder 110 receives the address signals and supplies a decoded row address signal (XADD) to the row decoder 140, and a decoded column address signal (YADD) to the column decoder 145. The address decoder 110 also receives the bank address signal (BADD) and supplies the bank address signal to both the row decoder 140 and the column decoder 145.

The command and address terminals can be supplied with command signals CMD, address signals ADDR, and chip selection signals CS, from a memory controller. The command signals can represent various memory commands from the memory controller (e.g., including access commands, which can include read commands and write commands). The select signal CS can be used to select the memory device 100 to respond to commands and addresses provided to the command and address terminals. When an active CS signal is provided to the memory device 100, the commands and addresses are decoded and memory operations are performed. The command signals CMD can be provided as internal command signals ICMD to a command decoder 115 via the command/address input circuit 105. The command decoder 115 includes circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data is read from memory cells in the memory array 150 designated by these row address and column address. The read command is received by the command decoder 115, which provides internal commands to input/output circuit 160 so that read data is output to outside from the data terminals DQ, RDQS, DBI, and DMI via read/write amplifiers 155 and the input/output circuit 160 according to the RDQS clock signals. The read data is provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When the write command is issued and a row address and a column address are timely supplied with the command, write data is supplied to the data terminals DQ, DBI, and DMI according to the WCK and WCKF clock signals. The write command is received by the command decoder 115, which provides internal commands to the input/output circuit 160 so that the write data is received by data receivers in the input/output circuit 160, and supplied via the input/output circuit 160 and the read/write amplifiers 155 to the memory array 150. The write data is written in the memory cell designated by the row address and the column address. The write data is provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal is also supplied with power supply potential VDDQ. The power supply potentials VDDQ is supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ is used for the input/output circuit 160 so that power supply noise generated by the input/output circuit 160 does not propagate to the other circuit blocks.

The clock terminals and data clock terminals are supplied with external clock signals and complementary external clock signals. The external clock signals CK, CKF, WCK, WCKF can be supplied to a clock input circuit 120. The CK and CKF signals are complementary, and the WCK and WCKF signals are complementary. Complementary clock signals have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 receive the external clock signals. For example, when enabled by a CKE signal from the command decoder 115, an input buffer receives the CK and CKF signals and the WCK and WCKF signals. The clock input circuit 120 can receive the external clock signals to generate internal clock signals ICLK. The internal clock signals ICLK are supplied to an internal clock circuit 130. The internal clock circuit 130 provides various phase and frequency controlled internal clock signal based on the received internal clock signals ICLK and a clock enable signal CKE from the address/command input circuit 105. For example, the internal clock circuit 130 can include a clock path (not shown in FIG. 1) that receives the internal clock signal ICLK and provides various clock signals to the command decoder 115. The internal clock circuit 130 further provides input/output (IO) clock signals. The IO clock signals are supplied to the input/output circuit 160 and are used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK are also supplied to a timing generator 135 and thus various internal clock signals can be generated.

Memory devices such as the memory device 100 of FIG. 1 can provide memory capacity with multiple memory arrays, or with a single array that is sub-divided into multiple separately-addressable portions (e.g., into multiple channels, banks, etc.). Alternatively, a memory system can include multiple memory devices such as the memory device 100 of FIG. 1, where each memory device represents a separately-addressable sub-division (e.g., rank, etc.) of the memory capacity of the system. Accordingly, a memory device or a memory system with multiple memory devices, ranks, channels, banks or the like can include multiple external data clock terminals (e.g., or other clock terminals) that are dedicated to one or more, but less than all of, the separately-addressable portions. For example, a multi-channel memory device can include multiple external data clock terminals corresponding to the multiple channels of memory. One such memory device is illustrated in a simplified schematic view in FIGS. 2A and 2B in accordance with an embodiment of the present technology.

Figure 2A:
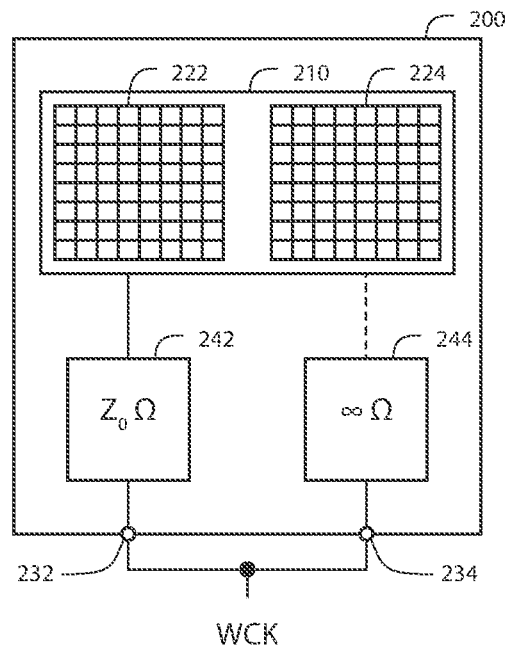
FIGS. 2a and 2b are simplified block diagrams schematically illustrating a memory device in accordance with an embodiment of the present technology.
Figure 2B:
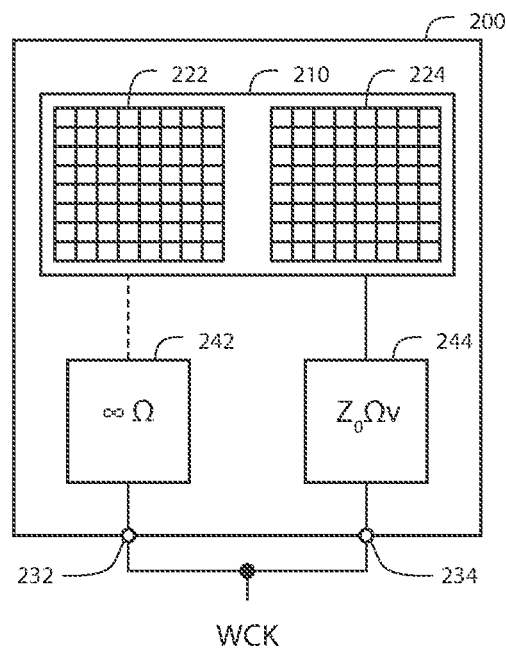

As can be seen with reference to FIGS. 2A and 2B, memory device 200 includes a memory array 210 sub-divided into a first plurality of memory cells 222 corresponding to a first channel and a second plurality of memory cells 224 corresponding to a second channel. The memory device 200 further includes first and second external data clock terminals 232 and 234, corresponding to the first and second channels, respectively. First and second external data clock terminals have each been illustrated as a single terminal, but the following description has application to differential clock arrangements where two terminals are provided for each complementary pair of clock signals (e.g., WCK and WCKF). For the purpose of clarity, the memory device 200 has been illustrated without the numerous other features of a memory device, set forth in greater detail above with reference to FIG. 1.

When operating the memory device 200, different external data clock signals can be provided to each of the first and second external data clock terminals 232 and 234, to facilitate the separate interactions with the first and second channels of the memory array 210. Such an arrangement, however, increases the complexity of the host or memory controller that must provide the different external data clock signals. Providing the same data clock signal WCK to both external data clock terminals 232 and 234, however, can present a challenge in impedance matching. In this regard, to reduce undesirable noise on the data clock path that can be caused by an impedance mismatch between the external data clock signal WCK and the memory device 200, the memory device 200 can alter the impedance of each internal data clock path using on-die termination. In this regard, the memory device 200 can include impedance adjustment circuitry (e.g., termination circuitry), such as first impedance adjustment circuitry 242 connected to the first external data clock terminal 232 and second impedance adjustment circuitry 244 connected to the second external data clock terminal 234. When a connected host or memory controller accesses the first plurality of memory cells 222 on the first channel, the memory device 200 can adjust, with the first impedance adjustment circuitry 242, the impedance at the corresponding data clock terminal 232 to match the impedance of the data clock signal WCK (e.g., adjusting the impedance 'seen' at that terminal to $Z_0\Omega$), and can adjust, with the second impedance adjustment circuitry 244, the impedance at the other data clock terminal 234 to a sufficiently high value (e.g., at or near $\infty\Omega$), such that it makes little or no contribution to the combined impedance of both terminals when connected in parallel, as is illustrated in FIG. 2a.

The drawback to this approach of switching on-die termination on and off becomes more apparent with reference to FIG. 2b, in which the host or memory controller subsequently interacts with the second plurality of memory cells 224 on the second channel of the array 210. Before the external data clock signal WCK can be propagated to the data clock tree of the memory device 200 that is connected to the second external terminal 234, there is a delay during which the memory device 200 reduces the impedance at that terminal 234 from the high value (e.g., at or near $\infty\Omega$) to an impedance that matches that of the applied data clock signal WCK (e.g., turning 'off' the on-die termination by adjusting the impedance 'seen' at that terminal to $Z_0\Omega$), and during which the impedance at the first terminal 232 is increased to the high value (e.g., to a value at or near $\infty\Omega$). This delay in adjusting the impedances can offset the benefit of sharing a common external data clock signal.

Figure 3:
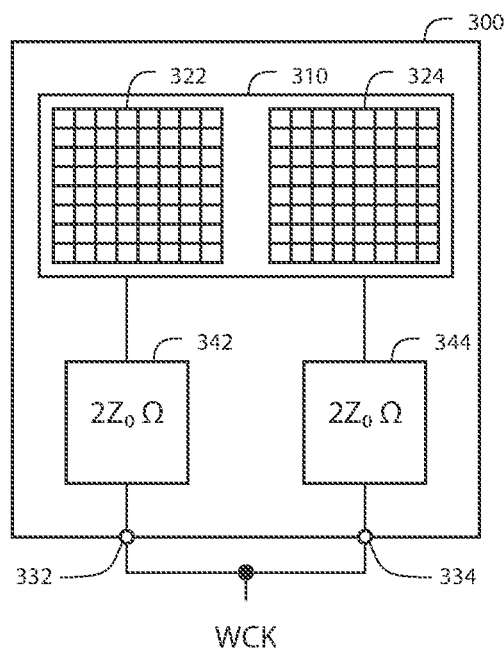
FIGS. 3-6 are simplified block diagrams schematically illustrating memory devices in accordance with embodiments of the present technology.

Embodiments of the present technology may solve the foregoing problem (among others) by providing a way to share a common external clock signal without incurring the delays of switching on-die termination on and off. Turning to FIG. 3, a simplified block diagram schematically illustrating a memory device 300 in accordance with an embodiment of the present technology is provided. The memory device 300 includes a memory array 310 sub-divided into a first plurality of memory cells 322 corresponding to a first channel and a second plurality of memory cells 324 corresponding to a second channel. The memory device 300 further includes first and second external data clock terminals 332 and 334, corresponding to the first and second channels, respectively. The first and second external data clock terminals 332 and 334 have each been illustrated as a single terminal, but the following description has application to differential clock arrangements where two terminals are provided for each complementary pair of clock signals (e.g., WCK and WCKF). The memory device 300 can further include impedance adjustment circuitry, such as first impedance adjustment circuitry 342 connected to the first external data clock terminal 332 and second impedance adjustment circuitry 344 connected to the second external data clock terminal 334. For the purpose of clarity, the memory device 300 has been illustrated without the numerous other features of a memory device, set forth in greater detail above with reference to FIG. 1.

As can be seen with reference to FIG. 3, a common external data clock signal WCK is provided to each of the first and second terminals 332 and 334 in parallel. Rather than providing one of these terminals with a sufficiently high impedance (e.g., at or near $\infty\Omega$) to prevent a significant contribution to the combined impedance of the terminals when connected in parallel, and providing the other with an impedance matching that of the external data clock signal WCK (e.g., at or about $Z_0\Omega$), the memory device 300 is configured to provide (e.g., with the first impedance adjustment circuitry 342 and the second impedance adjustment circuitry 344) each external clock terminal 332 and 334 with an impedance that is greater than the impedance of the applied external data clock signal WCK. In this regard, as the external data clock signal is provided to two terminals 332 and 334 in parallel, the first impedance adjustment circuitry 342 and the second impedance adjustment circuitry 344 are configured to provide each corresponding terminal 332 and 334 with an impedance $2\ Z_0\Omega$ that is twice the impedance $Z_0\Omega$ of the external data clock signal WCK.

Accordingly, the combined impedance of the two terminals 332 and 334, when connected in parallel, is about equal to the impedance of the external data clock signal WCK (e.g., $((2 Z_0\Omega)^{-1}+(2 Z_0\Omega)^{-1})^{-1}=Z_0\Omega$). The value of the combined impedance of the two terminals 332 and 334 may be described as equivalent to the impedance of the external data clock signal WCK because, although it may not be exactly the same value, it may perform the same function or otherwise be of a similar value to be effectively equal to or the same as the impedance of external data clock signal WCK.

With this configuration, both of the data clock paths of the memory device 300 can be provided with the data clock signal WCK simultaneously, so that a connected host or memory controller can sequentially access the first or second plurality of memory cells 322 or 324 without experiencing a delay due to on-die termination switching between the sequential accesses. Although there can be a slight reduction in the propagation of the data clock signal WCK within each clock tree, due to the increased impedance at each external terminal 332 and 334 (e.g., when compared with the on-die termination switching approach illustrated in FIGS. 2a and 2b), this can be addressed with clock tree optimization, and the benefit of sharing a common data clock signal without experiencing delays associated with on-die termination can outweigh these design costs.

In accordance with one aspect of the present disclosure, the impedance adjustment circuitry of a memory device, such as impedance adjustment circuitry 342 and 344 of memory device 300, can include impedance detection circuitry for detecting (e.g., determining) the impedance of an applied signal. In one aspect of the present technology, each impedance adjustment circuitry can include separate impedance detection circuitry, while in another aspect, multiple impedance adjustment circuitries can share one (or more) impedance detection circuitry. The impedance adjustment circuitry can further include one or more impedance multipliers and/or impedance dividers, configurable impedance tuners, and/or the like for providing a controllable impedance corresponding to (e.g., an integer multiple of, a ratio of, or any value greater than) the detected impedance of the applied clock signal.

Figure 4:
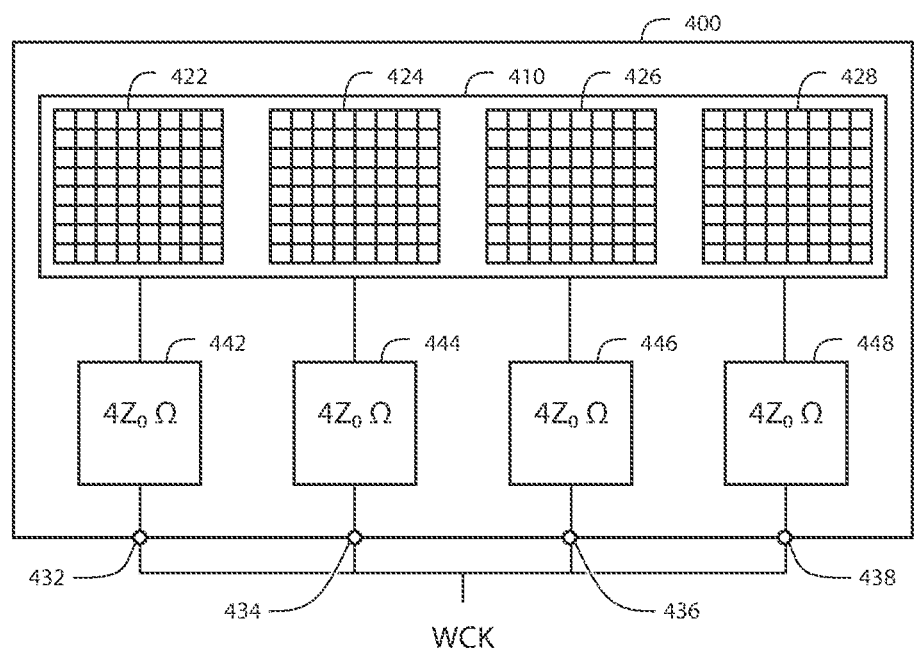

Although in the foregoing example embodiment, a memory device with two channels (and two corresponding external data clock terminals) has been illustrated, the foregoing approach to impedance matching an external clock signal applied to multiple terminals in parallel has application to memory devices with more than two external terminals. For example, FIG. 4 schematically illustrates a simplified block diagram of a memory device 400 in accordance with an embodiment of the present technology is provided. The memory device 400 includes a memory array 410 sub-divided into first through fourth pluralities of memory cells 422, 424, 426 and 428 corresponding to first through fourth channels, respectively. The memory device 400 further includes first through fourth external data clock terminals 432, 434, 436 and 438, also corresponding to the first through fourth channels, respectively. The first through fourth external data clock terminals 432, 434, 436 and 438 have each been illustrated as a single terminal, but the following description has application to differential clock arrangements where two terminals are provided for each complementary pair of clock signals (e.g., WCK and WCKF). The memory device 400 can further include impedance adjustment circuitry, such as first impedance adjustment circuitry 442 connected to the first external data clock terminal 432, second impedance adjustment circuitry 444 connected to the second external data clock terminal 434, third impedance adjustment circuitry 446 connected to the third external data clock terminal 436 and fourth impedance adjustment circuitry 448 connected to the fourth external data clock terminal 438. For the purpose of clarity, the memory device 400 has been illustrated without the numerous other features of a memory device, set forth in greater detail above with reference to FIG. 1.

As can be seen with reference to FIG. 4, a common external data clock signal WCK is provided to each of the first through fourth external data clock terminals 432, 434, 436 and 438 in parallel. Rather than providing three of these terminals with a sufficiently high impedance (e.g., at or near $\infty\Omega$) to prevent a significant contribution to the combined impedance of the terminals when connected in parallel, and providing the remaining terminal with an impedance matching that of the external data clock signal WCK (e.g., at or about $Z_0\Omega$), the memory device 400 is configured to provide each external clock terminal 432, 434, 436 and 438 with an impedance that is greater than the impedance of the applied external data clock signal WCK. In this regard, as the external data clock signal is provided to four terminals 432, 434, 436 and 438 in parallel, each of the first, second, third and fourth impedance adjustment circuitry 342, 344, 346 and 348 is configured to provide each corresponding terminal 432, 434, 436 and 438 with an impedance 4 $Z_0\Omega$ that is four times the impedance $Z_0\Omega$ of the external data clock signal WCK. Accordingly, the combined impedance of the four terminals 432, 434, 436 and 438, when connected in parallel, is about equal to the impedance of the external data clock signal WCK (e.g., $((4 Z_0\Omega)^{-1}+(4 Z_0\Omega)^{-1}+(4 Z_0\Omega)^{-1}+(4 Z_0\Omega)^{-1})^{-1}=Z_0\Omega$). With this configuration, all of the data clock paths of the memory device 400 are provided with the data clock signal WCK simultaneously, so that a connected host or memory controller can sequentially access any of the first through fourth pluralities of memory cells 422, 424, 426 or 428 without experiencing a delay due to on-die termination switching between the sequential accesses. Although there can be a slight reduction in the propagation of the data clock signal WCK within each clock tree, due to the increased impedance at each external terminal 432, 434, 436 and 438 (e.g., when compared with the on-die termination switching approach illustrated in FIGS. 2a and 2b), this can be addressed with clock tree optimization, and the benefit of sharing a common data clock signal without experiencing delays associated with on-die termination can outweigh these design costs.

Figure 5:
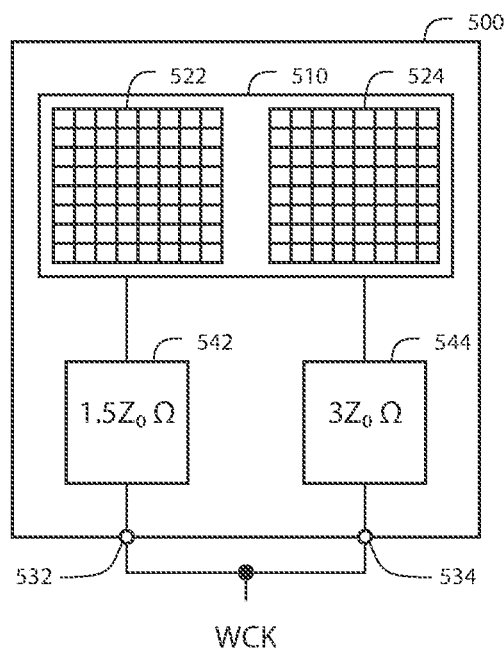

Although in the foregoing examples, memory devices with multiple external data clock terminals having the same impedance have been illustrated in described, in other embodiments of the present technology, a memory device can be configured with multiple external terminals having different impedances that, when connected in parallel, provided a combined impedance that matches that of an applied signal. For example, FIG. 5 schematically illustrates a simplified block diagram of a memory device 500 in accordance with an embodiment of the present technology is provided. The memory device 500 includes a memory array 510 sub-divided into a first plurality of memory cells 522 corresponding to a first channel and a second plurality of memory cells 524 corresponding to a second channel. The memory device 500 further includes first and second external data clock terminals 532 and 534, corresponding to the first and second channels, respectively. The first and second external data clock terminals 532 and 534 have each been illustrated as a single terminal, but the following description has application to differential clock arrangements where two terminals are provided for each complementary pair of clock signals (e.g., WCK and WCKF). The memory device 500 can further include impedance adjustment circuitry, such as first impedance adjustment circuitry 542 connected to the first external data clock terminal 532 and second impedance adjustment circuitry 544 connected to the second external data clock terminal 534. For the purpose of clarity, the memory device 500 has been illustrated without the numerous other features of a memory device, set forth in greater detail above with reference to FIG. 1.

As can be seen with reference to FIG. 5, a common external data clock signal WCK is provided to each of the first and second terminals 532 and 534 in parallel. Rather than providing one of these terminals with a sufficiently high impedance (e.g., at or near $\infty\Omega$) to prevent a significant contribution to the combined impedance of the terminals when connected in parallel, and providing the other with an impedance matching that of the external data clock signal WCK (e.g., at or about $Z_0\Omega$), the memory device 500 is configured to provide each external clock terminal 532 and 534 with an impedance that is greater than the impedance of the applied external data clock signal WCK, and which, when connected in parallel, provide a combined impedance about equal to the impedance $Z_0\Omega$ of the external data clock signal WCK. In this regard, the first impedance adjustment circuitry 542 is configured to provide the first terminal 532 with an impedance 1.5 $Z_0\Omega$ that is about one and a half times greater than the impedance $Z_0\Omega$ of the external data clock signal WCK, while the second impedance adjustment circuitry 544 is configured to provide the second terminal 534 with an impedance 3 $Z_0\Omega$ that is about three times greater than the impedance $Z_0\Omega$ of the external data clock signal WCK. Accordingly, the combined impedance of the two terminals 532 and 534, when connected in parallel, is about equal to the impedance of the external data clock signal WCK (e.g., $((1.5\ Z_0\Omega)^{-1}+(3\ Z_0\Omega)^{-1})^{-1}=Z_0\Omega$). With this configuration, both of the data clock paths of the memory device 500 are provided with the data clock signal WCK simultaneously, so that a connected host or memory controller can sequentially access the first or second plurality of memory cells 522 or 524 without experiencing a delay due to on-die termination switching between the sequential accesses. Although there can be a slight reduction in the propagation of the data clock signal WCK within each clock tree, due to the increased impedance at each external terminal 532 and 534 (e.g., when compared with the on-die termination switching approach illustrated in FIGS. 2a and 2b), this can be addressed with clock tree optimization, and the benefit of sharing a common data clock signal without experiencing delays associated with on-die termination can outweigh these design costs.

Alternatively, in another embodiment, the memory device 500 can be configured to reverse the impedances illustrated in FIG. 5 (e.g., so that the first terminal 532 is configured to have an impedance 3 $Z_0\Omega$ that is about three times greater than the impedance $Z_0\Omega$ of the external data clock signal WCK, and the second terminal 534 is configured to have an impedance 1.5 $Z_0\Omega$ that is about one and a half times greater than the impedance $Z_0\Omega$ of the external data clock signal WCK) depending upon which channel is accessed by a host or a memory controller. In this regard, the delay for adjusting an impedance value at an external terminal from 3 $Z_0\Omega$ to 1.5 $Z_0\Omega$ or vice versa can be a significantly shorter delay than for adjusting an impedance value at an external terminal from at or near $\infty Z_0\Omega$ to $Z_0\Omega$ or vice versa.

Figure 6:
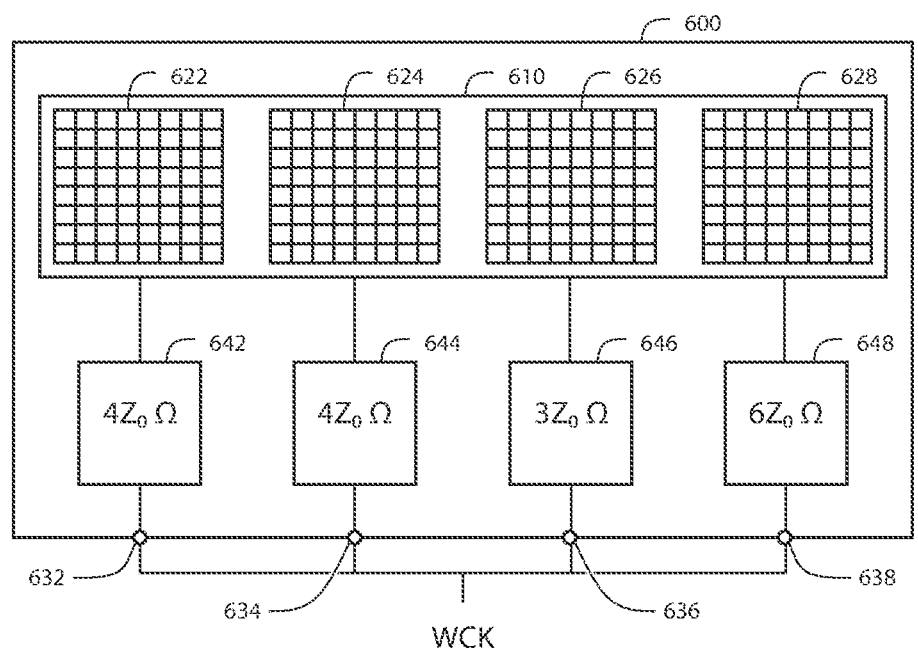

In another embodiment, a memory device can have multiple external data clock terminals, in which some of the terminals have the same impedance values, while others have different values (e.g., in a hybrid of the foregoing approaches). For example, FIG. 6 schematically illustrates a simplified block diagram of a memory device 600 in accordance with an embodiment of the present technology is provided. The memory device 600 includes a memory array 610 sub-divided into first through fourth pluralities of memory cells 622, 624, 626 and 628 corresponding to first through fourth channels, respectively. The memory device 600 further includes first through fourth external data clock terminals 632, 634, 636 and 638, also corresponding to the first through fourth channels, respectively. The first through fourth external data clock terminals 632, 634, 636 and 638 have each been illustrated as a single terminal, but the following description has application to differential clock arrangements where two terminals are provided for each complementary pair of clock signals (e.g., WCK and WCKF). The memory device 600 can further include impedance adjustment circuitry, such as first impedance adjustment circuitry 642 connected to the first external data clock terminal 632, second impedance adjustment circuitry 644 connected to the second external data clock terminal 634, third impedance adjustment circuitry 646 connected to the third external data clock terminal 636 and fourth impedance adjustment circuitry 648 connected to the fourth external data clock terminal 638. For the purpose of clarity, the memory device 600 has been illustrated without the numerous other features of a memory device, set forth in greater detail above with reference to FIG. 1.

As can be seen with reference to FIG. 6, a common external data clock signal WCK is provided to each of the first through fourth external data clock terminals 632, 634, 636 and 638 in parallel. Rather than providing three of these terminals with a sufficiently high impedance (e.g., at or near $\infty\Omega$) to prevent a significant contribution to the combined impedance of the terminals when connected in parallel, and providing the remaining terminal with an impedance matching that of the external data clock signal WCK (e.g., at or about $Z_0\Omega$), the memory device 600 is configured to provide each external clock terminal 632, 634, 636 and 638 with an impedance that is greater than the impedance of the applied external data clock signal WCK, and which, when connected in parallel, provide a combine impedance about equal to the impedance $Z_0\Omega$ of the external data clock signal WCK. In this regard, the first and second impedance adjustment circuitries 642 and 644 are configured to provide each of the corresponding first and second terminals 532 and 534 with an impedance 4 $Z_0\Omega$ that is about four times greater than the impedance $Z_0\Omega$ of the external data clock signal WCK, the third impedance adjustment circuitry 646 is configured to provide the third terminal 636 with an impedance 3 $Z_0\Omega$ that is about three times greater than the impedance $Z_0\Omega$ of the external data clock signal WCK, and the fourth impedance adjustment circuitry 648 is configured to provide the third terminal 638 with an impedance 6 $Z_0\Omega$ that is about six times greater than the impedance $Z_0\Omega$ of the external data clock signal WCK. Accordingly, the combined impedance of the four terminals 632, 634, 636 and 638, when connected in parallel, is about equal to the impedance of the external data clock signal WCK (e.g., $((4\ Z_0\Omega)^{-1}+(4\ Z_0\Omega)^{-1}+(3\ Z_0\Omega)^{-1}+(6\ Z_0\Omega)^{-1})^{-1}=Z_0\Omega$). With this configuration, all of the data clock paths of the memory device 600 are provided with the data clock signal WCK simultaneously, so that a connected host or memory controller can sequentially access any of the first through fourth pluralities of memory cells 622, 624, 626 or 628 without experiencing a delay due to on-die termination switching between the sequential accesses. Although there can be a slight reduction in the propagation of the data clock signal WCK within each clock tree, due to the increased impedance at each external terminal 632, 634, 636 and 638 (e.g., when compared with the on-die termination switching approach illustrated in FIGS. 2a and 2b), this can be addressed with clock tree optimization, and the benefit of sharing a common data clock signal without experiencing delays associated with on-die termination can outweigh these design costs.

Figure 7:
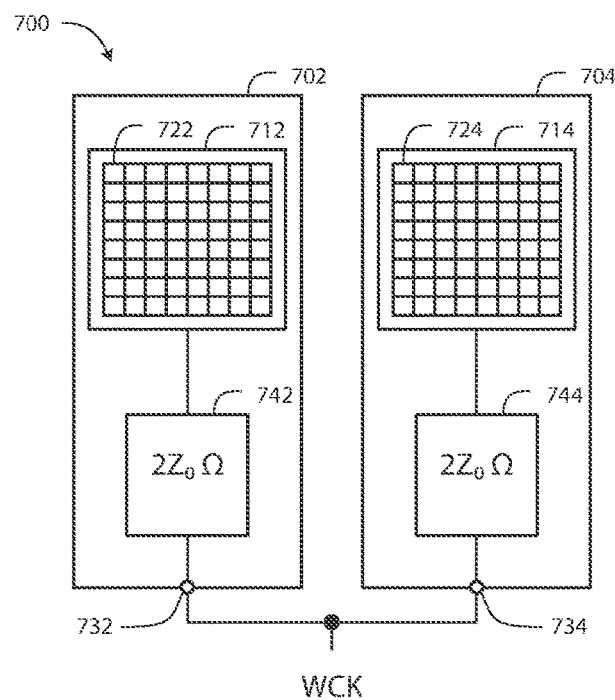
FIGS. 7-10 are simplified block diagrams schematically illustrating memory systems in accordance with embodiments of the present technology.

Although in the foregoing examples, a single clock signal is illustrated as being connected to multiple parallel terminals on a single memory device, in another embodiment of the present technology, memory systems having multiple memory devices can share a common clock signal, and be configured with the external terminal(s) of each memory device having an impedance greater than that of the external clock signal, and which, when connected in parallel, provide a combined impedance about equal to the impedance of the external clock signal. For example, FIG. 7 schematically illustrates a memory system 700 in accordance with an embodiment of the present technology. The memory system 700 includes two memory devices 702 and 704, each of which includes a memory array 712 and 714 with a corresponding plurality of memory cells 722 and 724 arranged in a single channel. Each memory device 702 and 704 further includes a single external data clock terminal 732 and 734. The external data clock terminals 732 and 734 have each been illustrated as a single terminal, but the following description has application to differential clock arrangements where two terminals are provided for each complementary pair of clock signals (e.g., WCK and WCKF). Each memory device 702 and 704 can further include impedance adjustment circuitry, such as first impedance adjustment circuitry 742 connected to the first external data clock terminal 732 and second impedance adjustment circuitry 744 connected to the second external data clock terminal 734. For the purpose of clarity, the memory devices 702 and 704 have been illustrated without the numerous other features of a memory device, set forth in greater detail above with reference to FIG. 1.

As can be seen with reference to FIG. 7, a common external data clock signal WCK is provided to each of the terminals 332 and 334 of the memory devices 702 and 704 in parallel. Rather than providing one of these terminals with a sufficiently high impedance (e.g., at or near $\infty\Omega$) to prevent a significant contribution to the combined impedance of the terminals when connected in parallel, and providing the other with an impedance matching that of the external data clock signal WCK (e.g., at or about $Z_0\Omega$), the memory system 700 is configured so that each memory device 702 and 704 provides its external clock terminal 732 and 734 with an impedance that is greater than the impedance of the applied external data clock signal WCK. In this regard, as the external data clock signal is provided to two terminals 732 and 734 in parallel, each of the first and second impedance adjustment circuitry 742 and 744 is configured to provide the corresponding terminal 732 and 734 with an impedance $2 Z_0\Omega$ that is twice the impedance $Z_0\Omega$ of the external data clock signal WCK. Accordingly, the combined impedance of the two terminals 732 and 734, when connected in parallel, is about equal to the impedance of the external data clock signal WCK (e.g., $((2\ Z_0\Omega)^{-1}+(2\ Z_0\Omega)^{-1})^{-1}=Z_0\Omega$). With this configuration, the data clock path of each of the two memory devices 702 and 704 are provided with the data clock signal WCK simultaneously, so that a connected host or memory controller can sequentially access either plurality of memory cells 722 or 724 without experiencing a delay due to on-die termination switching between the sequential accesses. Moreover, the connected host or memory controller can also be configured to access both memory devices 702 and 704 simultaneously, which is a further benefit of various embodiments of the present technology. Although there can be a slight reduction in the propagation of the data clock signal WCK within the clock tree of each memory device 702 and 704, due to the increased impedance at each external terminal 732 and 734 (e.g., when compared with the on-die termination switching approach illustrated in FIGS. 2a and 2b), this can be addressed with clock tree optimization, and the benefit of sharing a common data clock signal without experiencing delays associated with on-die termination can outweigh these design costs.

Figure 8:
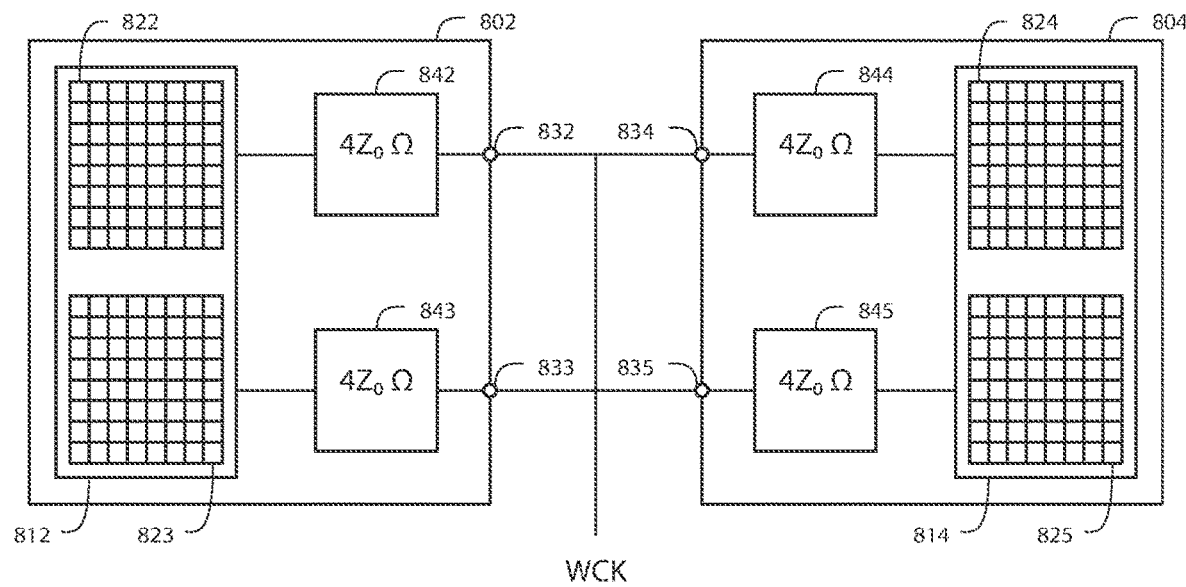

Although the foregoing example has described an illustrated a memory system with multiple single-channel memory devices sharing a common clock signal, in other embodiments of the present technology memory systems can include multiple memory devices, each with multiple channels, all of which share a common clock signal. For example, FIG. 8 schematically illustrates a memory system 800 in accordance with an embodiment of the present technology. The memory system 800 includes two memory devices 802 and 804, each of which includes a memory array 812 and 814. The memory array 812 of the first memory device 802 is sub-divided into a first plurality of memory cells 822 corresponding to a first channel and a second plurality of memory cells 823 corresponding to a second channel. The memory array 814 of the second memory device 804 is sub-divided into a third plurality of memory cells 824 corresponding to a third channel and a fourth plurality of memory cells 825 corresponding to a fourth channel. The first memory device 802 includes first and second external data clock terminals 832 and 833, corresponding to the first and second channels, and the second memory device 804 includes third and fourth external data clock terminals 834 and 835, corresponding to the third and fourth channels. The first through fourth external data clock terminals 832-835 have each been illustrated as a single terminal, but the following description has application to differential clock arrangements where two terminals are provided for each complementary pair of clock signals (e.g., WCK and WCKF). Each memory device 802 and 804 can further include impedance adjustment circuitry, such as first impedance adjustment circuitry 842 connected to the first external data clock terminal 832, second impedance adjustment circuitry 843 connected to the second external data clock terminal 833, third impedance adjustment circuitry 844 connected to the third external data clock terminal 834, and fourth impedance adjustment circuitry 845 connected to the fourth external data clock terminal 835. For the purpose of clarity, the memory devices 802 and 804 have been illustrated without the numerous other features of a memory device, set forth in greater detail above with reference to FIG. 1.

As can be seen with reference to FIG. 8, a common external data clock signal WCK is provided to each of the terminals 832-835 of the memory devices 802 and 804 in parallel. Rather than providing one of these terminals with a sufficiently high impedance (e.g., at or near $\infty\Omega$) to prevent a significant contribution to the combined impedance of the terminals when connected in parallel, and providing the other remaining terminal with an impedance matching that of the external data clock signal WCK (e.g., at or about $Z_0\Omega$), the memory system 800 is configured so that each memory device 802 and 804 provides its external clock terminals 832-835 with an impedance that is greater than the impedance of the applied external data clock signal WCK. In this regard, as the external data clock signal is provided to four terminals 832-835 in parallel, each terminal is configured (e.g., by its corresponding impedance adjustment circuitry 842-845) to have an impedance 4 $Z_0\Omega$ that is four times the impedance $Z_0\Omega$ of the external data clock signal WCK. Accordingly, the combined impedance of the four terminals 832-835, when connected in parallel, is about equal to the impedance of the external data clock signal WCK (e.g., $((4\ Z_0\Omega)^{-1}+(4\ Z_0\Omega)^{-1}+(4\ Z_0\Omega)^{-1}+(4\ Z_0\Omega)^{-1})^{-1}=Z_0\Omega)$. With this configuration, both data clock paths of each of the two memory devices 802 and 804 are provided with the data clock signal WCK simultaneously, so that a connected host or memory controller can sequentially access either plurality of memory cells in a memory device without experiencing a delay due to on-die termination switching between the sequential accesses. Moreover, the connected host or memory controller can also be configured one of the channels on each memory device 802 and 804 simultaneously, which is a further benefit of various embodiments of the present technology. Although there can be a slight reduction in the propagation of the data clock signal WCK within the clock trees of each memory device 802 and 804, due to the increased impedance at each external terminal 832-835 (e.g., when compared with the on-die termination switching approach illustrated in FIGS. 2a and 2b), this can be addressed with clock tree optimization, and the benefit of sharing a common data clock signal without experiencing delays associated with on-die termination can outweigh these design costs.

Figure 9:
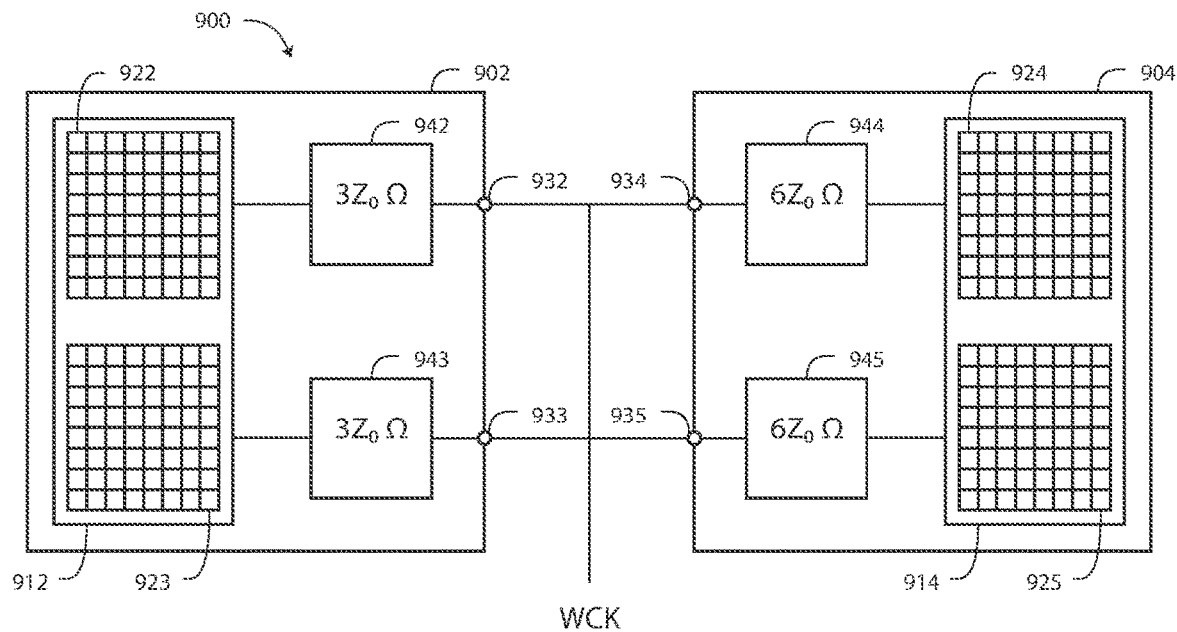

Although in the foregoing examples of FIGS. 7 and 8, memory systems having memory devices with multiple external data clock terminals having the same impedance have been illustrated in described, in other embodiments of the present technology, memory systems can include memory devise configured with multiple external terminals having different impedances that, when connected in parallel, provided a combined impedance that matches that of an applied signal. For example, FIG. 9 schematically illustrates a simplified block diagram of a memory system 900 in accordance with an embodiment of the present technology is provided. The memory system 900 includes two memory devices 902 and 904, each of which includes a memory array 912 and 914. The memory array 912 of the first memory device 902 is sub-divided into a first plurality of memory cells 922 corresponding to a first channel and a second plurality of memory cells 923 corresponding to a second channel. The memory array 914 of the second memory device 904 is sub-divided into a third plurality of memory cells 924 corresponding to a third channel and a fourth plurality of memory cells 925 corresponding to a fourth channel. The first memory device 902 includes first and second external data clock terminals 932 and 933, corresponding to the first and second channels, and the second memory device 904 includes third and fourth external data clock terminals 934 and 935, corresponding to the third and fourth channels. The first through fourth external data clock terminals 932-935 have each been illustrated as a single terminal, but the following description has application to differential clock arrangements where two terminals are provided for each complementary pair of clock signals (e.g., WCK and WCKF). Each memory device 902 and 904 can further include impedance adjustment circuitry, such as first impedance adjustment circuitry 942 connected to the first external data clock terminal 932, second impedance adjustment circuitry 943 connected to the second external data clock terminal 933, third impedance adjustment circuitry 944 connected to the third external data clock terminal 934, and fourth impedance adjustment circuitry 945 connected to the fourth external data clock terminal 935. For the purpose of clarity, the memory devices 902 and 904 have been illustrated without the numerous other features of a memory device, set forth in greater detail above with reference to FIG. 1.

As can be seen with reference to FIG. 9, a common external data clock signal WCK is provided to each of the terminals 932-935 of the memory devices 902 and 904 in parallel. Rather than providing one of these terminals with a sufficiently high impedance (e.g., at or near $\infty\Omega$) to prevent a significant contribution to the combined impedance of the terminals when connected in parallel, and providing the other remaining terminal with an impedance matching that of the external data clock signal WCK (e.g., at or about $Z_0\Omega$), the memory system 900 is configured so that each memory device 902 and 904 provides (e.g., with its corresponding impedance adjustment circuitry 942-945) its external clock terminals 932-935 with an impedance that is greater than the impedance of the applied external data clock signal WCK. In this regard, the first and second terminal 932 and 933 are each configured to have an impedance 3 $Z_0\Omega$ that is three times the impedance $Z_0\Omega$ of the external data clock signal WCK, and the third and fourth terminals 934 and 935 are each configured to have an impedance 6 $Z_0\Omega$ that is six times the impedance $Z_0\Omega$ of the external data clock signal WCK. Accordingly, the combined impedance of the four terminals 932-935, when connected in parallel, is about equal to the impedance of the external data clock signal WCK (e.g., $((3\ Z_0\Omega)^{-1}+(3\ Z_0\Omega)^{-1}+(6\ Z_0\Omega)^{-1}+(6\ Z_0\Omega)^{-1})^{-1}=Z_0\Omega)$. With this configuration, both data clock paths of each of the two memory devices 902 and 904 are provided with the data clock signal WCK simultaneously, so that a connected host or memory controller can sequentially access either plurality of memory cells in a memory device without experiencing a delay due to on-die termination switching between the sequential accesses. Moreover, the connected host or memory controller can also be configured one of the channels on each memory device 902 and 904 simultaneously, which is a further benefit of various embodiments of the present technology. Although there can be a slight reduction in the propagation of the data clock signal WCK within the clock trees of each memory device 902 and 904, due to the increased impedance at each external terminal 932-935 (e.g., when compared with the on-die termination switching approach illustrated in FIGS. 2a and 2b), this can be addressed with clock tree optimization, and the benefit of sharing a common data clock signal without experiencing delays associated with on-die termination can outweigh these design costs.

Figure 10:
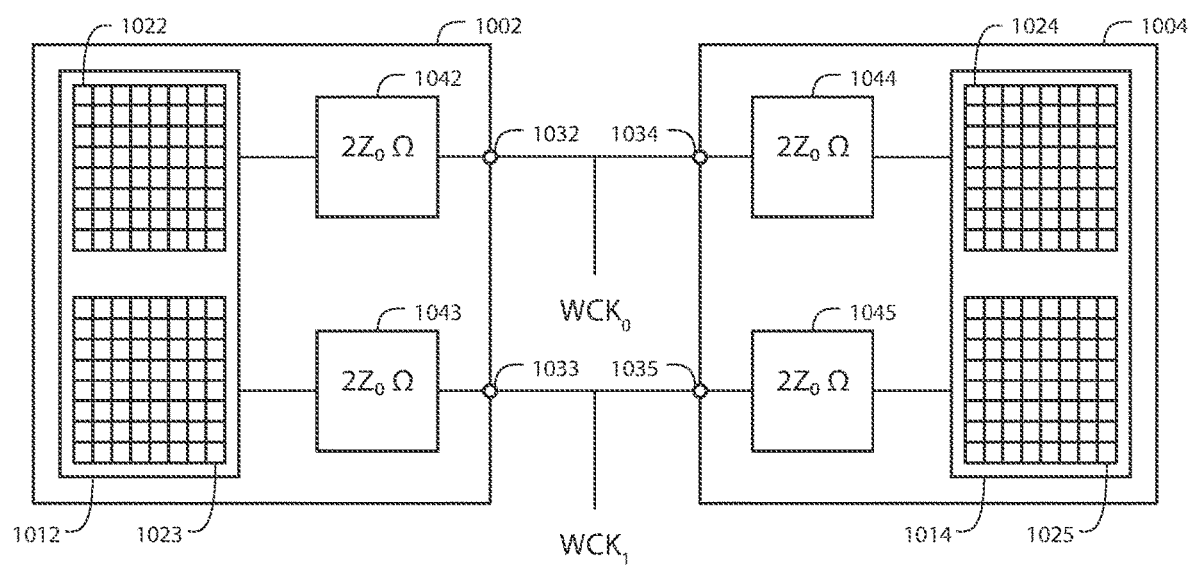

Although in the foregoing examples of FIGS. 7-9, memory systems have been described and illustrated as sharing a single common clock signal, in other embodiments of the present technology, memory systems can include multiple memory devices in which multiple clock signals are each shared with more than one but less than all of the external clock terminals of the memory system. For example, FIG. 10 schematically illustrates a memory system 1000 in accordance with an embodiment of the present technology. The memory system 1000 includes two memory devices 1002 and 1004, each of which includes a memory array 1012 and 1014. The memory array 1012 of the first memory device 1002 is sub-divided into a first plurality of memory cells 1022 corresponding to a first channel and a second plurality of memory cells 1023 corresponding to a second channel. The memory array 1014 of the second memory device 1004 is sub-divided into a third plurality of memory cells 1024 corresponding to a third channel and a fourth plurality of memory cells 1025 corresponding to a fourth channel. The first memory device 1002 includes first and second external data clock terminals 1032 and 1033, corresponding to the first and second channels, and the second memory device 1004 includes third and fourth external data clock terminals 1034 and 1035, corresponding to the third and fourth channels. The first through fourth external data clock terminals 1032-1035 have each been illustrated as a single terminal, but the following description has application to differential clock arrangements where two terminals are provided for each complementary pair of clock signals (e.g., WCK and WCKF). Each memory device 1002 and 1004 can further include impedance adjustment circuitry, such as first impedance adjustment circuitry 1042 connected to the first external data clock terminal 1032, second impedance adjustment circuitry 1043 connected to the second external data clock terminal 1033, third impedance adjustment circuitry 1044 connected to the third external data clock terminal 1034, and fourth impedance adjustment circuitry 1045 connected to the fourth external data clock terminal 1035. For the purpose of clarity, the memory devices 1002 and 1004 have been illustrated without the numerous other features of a memory device, set forth in greater detail above with reference to FIG. 1.

As can be seen with reference to FIG. 10, a first external data clock signal $WCK_0$ is provided to the first terminal 1032 of the first memory device 1002 and to the third terminal 1034 of the second memory device 1004, and a second external data clock signal $WCK_1$ is provided to the second terminal 1033 of the first memory device 1002 and to the fifth terminal 1035 of the second memory device 1004. Rather than providing one of each pair of commonly-connected terminals with a sufficiently high impedance (e.g., at or near $\infty\Omega$) to prevent a significant contribution to the combined impedance of the terminals when connected in parallel, and providing the other terminal with an impedance matching that of the corresponding external data clock signal $WCK_0$ or $WCK_1$ (e.g., at or about $Z_0\Omega$), the memory system 1000 is configured so that each memory device 1002 and 1004 provides its external clock terminals 1032-1035 with an impedance that is greater than the impedance of the corresponding applied external data clock signal $WCK_0$ and $WCK_1$. In this regard, each terminal is configured (e.g., by its corresponding impedance adjustment circuitry 1042-1045) to have an impedance 2 $Z_0\Omega$ that is twice the impedance $Z_0\Omega$ of its corresponding external data clock signal $WCK_0$ or $WCK_1$. Accordingly, the combined impedance of each pair of commonly-connected terminals, when connected in parallel, is about equal to the impedance of the external data clock signal WCK (e.g., $((2\ Z_0\Omega)^{-1}+(2\ Z_0\Omega)^{-1})^{-1}=Z_0\Omega$).

Figure 11:
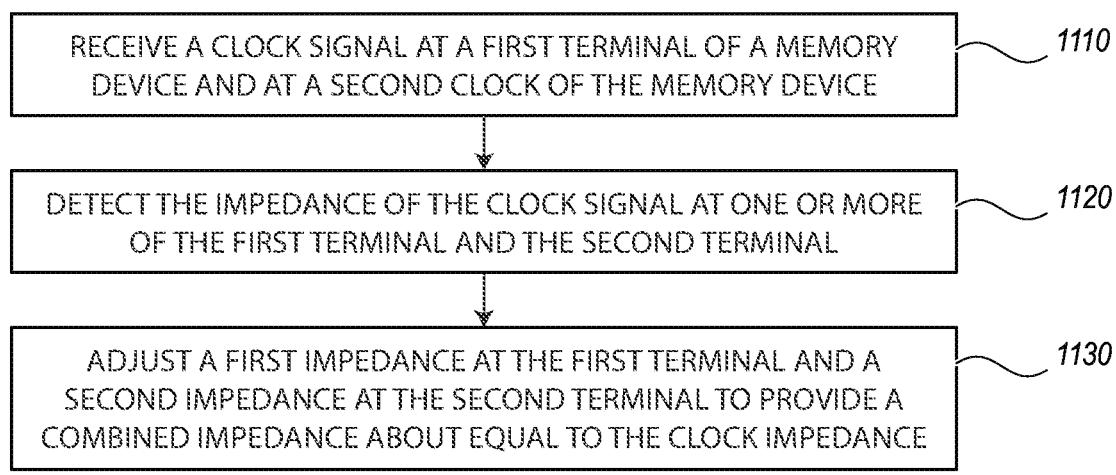
FIGS. 11-13 are flow charts illustrating methods of operating memory devices and memory systems in accordance with embodiments of the present technology.

FIG. 11 is a flow chart illustrating a method of operating a memory device in accordance with an embodiment of the present technology. The method includes receiving a clock signal having a clock impedance at a first clock terminal of the memory device corresponding to the first channel and at a second clock terminal of the memory device corresponding to the second channel (box 1110). For example, the features of block 1110 may be performed by CLK input circuit 120, and/or the various terminals connected thereto, in one embodiment of the present technology. The method can further include detecting the clock impedance at one or more of the first clock terminal and the second clock terminal (box 1120), and adjusting a first impedance at the first clock terminal and a second impedance at the second clock terminal to provide a combined impedance about equal to the clock impedance (box 1130). For example, according to one embodiment of the present technology, the features of blocks 1120 and 1130 may be performed by CLK input circuit 120. In accordance with one aspect of the present technology, the first impedance and the second impedance can both be greater than the clock impedance. In accordance with another aspect of the present technology, the first and second impedances can be about equal, or can be different.

Figure 12:
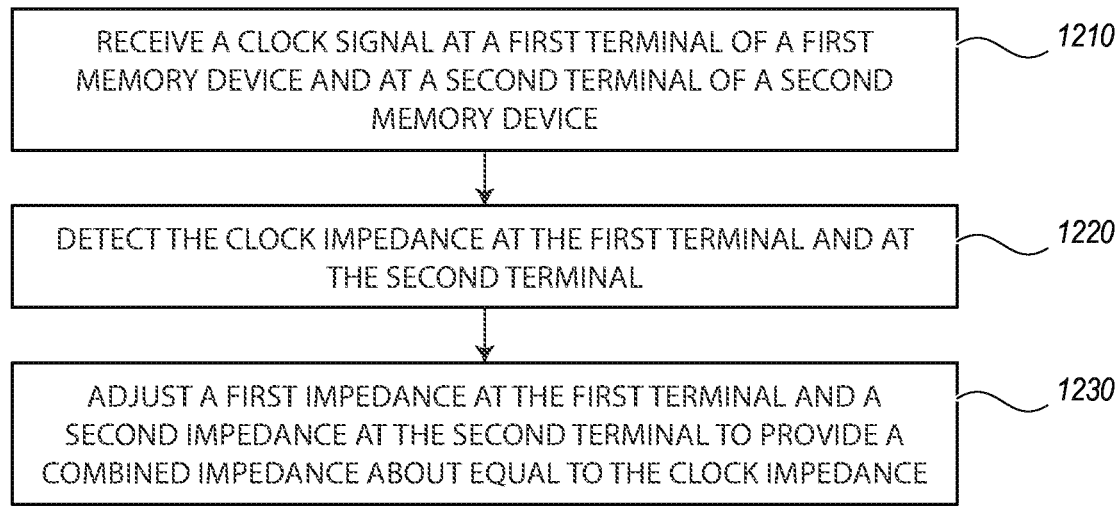

FIG. 12 is a flow chart illustrating a method of operating a memory system having a first memory device and a second memory device in accordance with an embodiment of the present technology. The method includes receiving a clock signal having a clock impedance at a first clock terminal of the first memory device and at a second clock terminal of the second memory device (box 1210). For example, the features of block 1210 may be performed by multiple CLK input circuits 120 of multiple memory devices 100, and/or the various terminals connected thereto, in one embodiment of the present technology. The method can further include detecting the clock impedance at the first clock terminal and at the second clock terminal (box 1220) and adjusting a first impedance at the first clock terminal and a second impedance at the second clock terminal to provide a combined impedance about equal to the clock impedance (box 1230). For example, according to one embodiment of the present technology, the features of blocks 1220 and 1230 may be performed by multiple CLK input circuits 120 of multiple memory devices 100. In accordance with one aspect of the present technology, the first impedance and the second impedance can both be greater than the clock impedance. In accordance with another aspect of the present technology, the first and second impedances can be about equal, or can be different.

Figure 13:
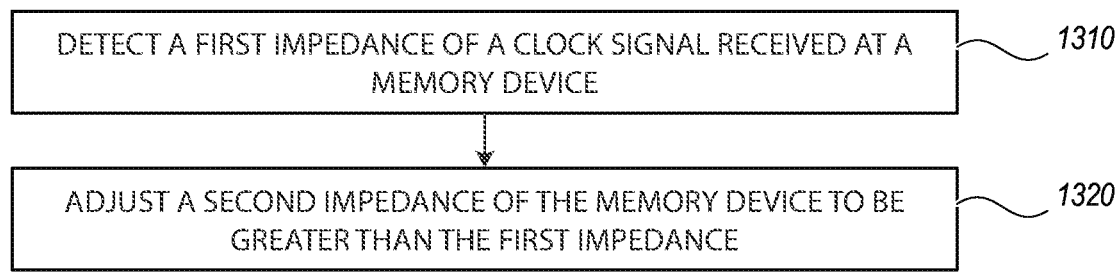

FIG. 13 is a flow chart illustrating a method of operating a memory device in accordance with an embodiment of the present technology. The method includes detecting a first impedance of a clock signal applied to the memory device (box 1310) and adjusting a second impedance of the memory device to be greater than the first impedance (box 1320). In accordance with one aspect of the present technology, the second impedance can be an integer multiple of the first impedance, wherein the integer multiple is two or greater.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A memory device, comprising:
   first impedance adjustment circuitry configured to provide a first impedance to a received clock signal having a clock impedance; and
   second impedance adjustment circuitry configured to provide a second impedance to the received clock signal;
   wherein the first impedance adjustment circuitry and the second impedance adjustment circuitry include impedance detection circuitry configured to detect the clock impedance, and
   wherein the first impedance and the second impedance are configured to provide a combined impedance based at least in part on the detected clock impedance.

2. The memory device of claim 1, wherein the combined impedance is equivalent to the clock impedance when the first impedance adjustment circuitry and the second impedance adjustment circuitry are connected to the received clock signal and in parallel with each another.

3. The memory device of claim 1, wherein the first impedance and the second impedance are both greater than the clock impedance.

4. The memory device of claim 1, wherein the first impedance adjustment circuitry and the second impedance adjustment circuitry include impedance multiplier circuitry configured to generate the first impedance as a multiple of the clock impedance.

5. The memory device of claim 1, wherein the first impedance is equivalent to the second impedance.

6. The memory device of claim 1, wherein the received clock signal is a data clock signal.

7. The memory device of claim 1, further comprising:
   a first terminal coupled to the first impedance adjustment circuitry and configured to receive the clock signal; and
   a second terminal coupled to the second impedance adjustment circuitry and configured to receive the clock signal.

8. The memory device of claim 1, wherein the received clock signal is a differential clock signal comprising a first clock signal and a complimentary second clock signal.

9. The memory device of claim 1, wherein a single semiconductor die comprises the first impedance adjustment circuitry and the second impedance adjustment circuitry.

10. The memory device of claim 1, wherein a first semiconductor die comprises the first impedance adjustment circuitry and a second semiconductor die comprises the second impedance adjustment circuitry.

11. The memory device of claim 1, wherein the memory device is a dynamic random access memory (DRAM) device.

12. A memory system, comprising:
   a first memory device including first impedance adjustment circuitry configured to provide a first impedance to a received clock signal having a clock impedance; and
   a second memory device including second impedance adjustment circuitry configured to provide a second impedance to the received clock signal;
   wherein the first impedance adjustment circuitry and the second impedance adjustment circuitry include impedance detection circuitry configured to detect the clock impedance, and
   wherein the first impedance and the second impedance are configured to provide a combined impedance equivalent to the detected clock impedance when the first impedance adjustment circuitry and the second impedance adjustment circuitry are connected to the received clock signal in parallel.

13. The memory system of claim 12, wherein the first impedance and the second impedance are both greater than the clock impedance.

14. The memory system of claim 12, wherein the first impedance adjustment circuitry and the second impedance adjustment circuitry include impedance multiplier circuitry configured to generate the first impedance as a multiple of the clock impedance.

15. The memory system of claim 12, wherein the first impedance is equivalent to the second impedance.

16. The memory system of claim 12, wherein the received clock signal is a data clock signal.

17. The memory system of claim 12, wherein:
   the first memory device further includes third impedance adjustment circuitry configured to provide a third impedance to the received clock signal;

the second memory device further includes fourth impedance adjustment circuitry configured to provide a fourth impedance to the received clock signal; and the first impedance, the second impedance, the third impedance and the fourth impedance are configured to provide the combined impedance equivalent to the clock impedance when the first impedance adjustment circuitry, the second impedance adjustment circuitry, the third impedance adjustment circuitry and the fourth impedance adjustment circuitry are connected to the received clock signal in parallel.

18. The memory system of claim 17. wherein the first impedance, the second impedance, the third impedance and the fourth impedance are each equivalent to one another.

19. The memory system of claim 17, wherein at least one of the first impedance, the second impedance, the third impedance or the fourth impedance is different than at least one of the first impedance, the second impedance, the third impedance or the fourth impedance.

20. A method comprising:
receiving a clock signal having a clock impedance at a first clock terminal of a first memory device;
receiving the clock signal having the clock impedance at a second clock terminal of a second memory device;
detecting the clock impedance at the first clock terminal and at the second clock terminal; and
adjusting a first impedance at the first clock terminal and a second impedance at the second clock terminal to provide a combined impedance that is based at least in part on the detected clock impedance.

21. The method of claim 20, wherein the first impedance and the second impedance are both greater than the clock impedance.

22. The method of claim 20, wherein the first impedance is equivalent to the second impedance.

23. The method of claim 20, wherein the received clock signal is a data clock signal.

24. The method of claim 20, wherein the received clock signal is a differential clock signal comprising a first clock signal and a complimentary second clock signal.

* * * * *